United States Patent
Huang

(10) Patent No.: US 7,029,313 B1
(45) Date of Patent: Apr. 18, 2006

(54) AUXILIARY DEVICE FOR ASSISTING ELECTRICAL CONNECTION

(75) Inventor: Jui-Ching Huang, Samutprakam (TH)

(73) Assignees: Delta Electronics, Inc., Taoyuan Hsien (TW); Delta Electronics (Thailand) Public Company, Limited, Samutprakarn (TH)

(*) Notice: Subject to any disclaimer, the term of this patent is extended or adjusted under 35 U.S.C. 154(b) by 0 days.

(21) Appl. No.: 11/132,882

(22) Filed: May 19, 2005

(51) Int. Cl.
*H01R 13/64* (2006.01)

(52) U.S. Cl. .......................... 439/381; 439/83

(58) Field of Classification Search ............... 439/380, 439/381, 620, 82, 83; 174/260, 266; 361/773
See application file for complete search history.

(56) References Cited

U.S. PATENT DOCUMENTS

| | | | |
|---|---|---|---|
| 3,793,720 A | * | 2/1974 | Van Rijsewijk et al. ...... 29/837 |
| 4,606,120 A | * | 8/1986 | McAndrew .................. 29/837 |
| 4,992,054 A | * | 2/1991 | Cassan ....................... 439/892 |
| 6,572,412 B1 | * | 6/2003 | Beuther et al. ............. 439/620 |
| 6,623,282 B1 | * | 9/2003 | Boyd .......................... 439/83 |

* cited by examiner

Primary Examiner—Tho D. Ta
(74) Attorney, Agent, or Firm—Madson & Austin

(57) ABSTRACT

An auxiliary device is used for assisting electrical connection between pins of an electronic component and corresponding contact portions of a printed circuit board. The auxiliary device includes a main body and a plurality of connection parts. The main body has a plurality of perforations for the pins to penetrate therethrough. The connection parts are coupled to the main body and penetrate through corresponding retaining holes of the printed circuit board such that the main body is fixed on the printed circuit board. The pins of the electronic component penetrate through corresponding perforations of the main body and are in contact with corresponding contact portions of the printed circuit board.

14 Claims, 4 Drawing Sheets

AUXILIARY DEVICE FOR ASSISTING ELECTRICAL CONNECTION

FIELD OF THE INVENTION

The present invention relates to an auxiliary device, and more particularly to an auxiliary device for assisting electrical connection between pins of an electronic component and corresponding contact portions of a printed circuit board.

BACKGROUND OF THE INVENTION

With increasing development of electronic industries, electronic components such as resistors, capacitors, inductors and chips are widely used in personal computers and peripheral devices thereof, mobile phones, network cards or other electronic products. These electronic products are operated and controlled by the circuits arranged on the printed circuit board, and driven by the electronic components thereon.

Referring to FIG. 1(a), a schematic view illustrating an electronic component to be mounted on a printed circuit board is illustrated. The printed circuit board 11 has traces (not shown) on a surface thereof and a plurality of contact portions 111 and 112 such as via holes or contact pads to be electrically connected to the electronic component 12. In a case that the contact portions 111 and 112 are via holes, the pins 121 and 122 of the electronic component 12 penetrate through the via holes 111 and 112, and then the solder is molten and welded onto the bottom surface of the printed circuit board 11 to form solder bumps 13. In such circumstance, the electronic component 12 is mounted on and electrically connected to the printed circuit board 11.

Since the electronic product is developed toward miniaturization, the area of the printed circuit board 11 is shortened, and more electronic components should be mounted on the printed circuit board 11 with reduced area. Accordingly, the distance between the two via holes 111 and 112 is shortened, and the solder bumps 13 may be in contact with each other due to the reduced distance. In this circumstance, the printed circuit board 11 is probably short-circuited or even damaged.

According to specified safe specification, for example, the distance between the pins 121 and 122 of the electronic component 12 should be greater than a specific length (for example 5 mm) to assure a good electrical property. As shown in FIG. 1(b), an insulation gel 14 is coated on the printed circuit board 11 to facilitate fixing the pins 121 and 122 on the printed circuit board 11. Unfortunately, the pins 121 and 122 above the printed circuit board 11 are readily deformed when an external force is applied thereon. In this circumstance, the distance between these two pins 121 and 122 may be reduced and fail to meet the safe specification. Accordingly, the electrical property and yield of the electronic product will be impaired.

In view of the above-described disadvantages, the applicant has diligently developed an auxiliary device according to the present invention through wholehearted experience and research.

SUMMARY OF THE INVENTION

An object of the present invention is to provide an auxiliary device for assisting electrical connection between pins of an electronic component and corresponding contact portions of a printed circuit board so as to prevent the printed circuit board from being short-circuited or damaged.

Another object of the present invention is to provide an auxiliary device for assisting the electrical component to be firmly fixed on the printed circuit board so as to maintain a safe distance when an external force is applied on the electrical component.

In accordance with a first aspect of the present invention, there is provided an auxiliary device for assisting electrical connection between pins of an electronic component and corresponding contact portions of a printed circuit board. The auxiliary device comprises a main body and a plurality of connection parts. The main body has a plurality of perforations for the pins to penetrate therethrough. The connection parts are coupled to the main body and penetrate through corresponding retaining holes of the printed circuit board such that the main body is fixed on the printed circuit board. The pins of the electronic component penetrate through corresponding perforations of the main body and are in contact with corresponding contact portions of the printed circuit board.

Preferably, the electronic component is a resistor, a capacitor, an inductor or a chip.

In an embodiment, the main body comprises a first sleeve and a second sleeve coupled with each other, and the pins comprises a first pin and a second pins.

Preferably, the connection parts are integrated into the main body.

In an embodiment, the perforations comprise a first perforation and a second perforation disposed in the first sleeve and the second sleeve, respectively.

In an embodiment, the first pin and the second pin penetrate through the first perforation and second perforation, respectively.

In an embodiment, the first sleeve further comprises a receptacle for accommodating at least a portion of the electronic component.

In an embodiment, the distance between the first perforation and the second perforation is equal to or greater than a specific length.

In an embodiment, the specific length is about 5 mm.

In accordance with a second aspect of the present invention, there is provided a packaged structure of an electronic product. The packaged structure comprises a printed circuit board, an electronic component and an auxiliary device. The electronic component has a plurality of pins and is disposed on a surface of the printed circuit board. The auxiliary device is used for assisting electrical connection between the pins of the electronic component and corresponding contact portions of the printed circuit board. The auxiliary device comprises a main body and a plurality of connection parts. The main body has a plurality of perforations for the pins to penetrate therethrough. The connection parts are coupled to the main body and penetrate through corresponding retaining holes of the printed circuit board such that the main body is fixed on the printed circuit board. The pins of the electronic component penetrate through corresponding perforations of the main body and are in contact with corresponding contact portions of the printed circuit board.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
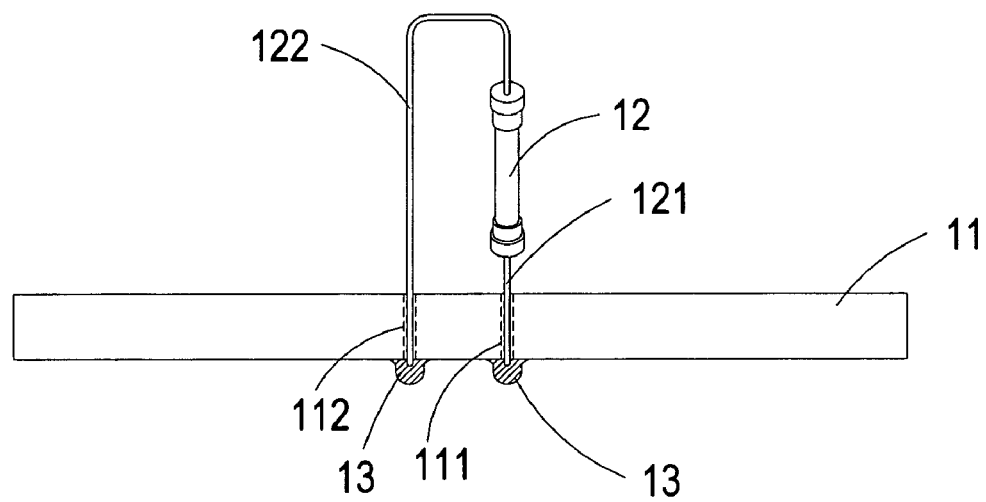
FIG. 1(a) is a schematic view illustrating an electronic component to be mounted on a printed circuit board according to a conventional approach.
Figure 1B:
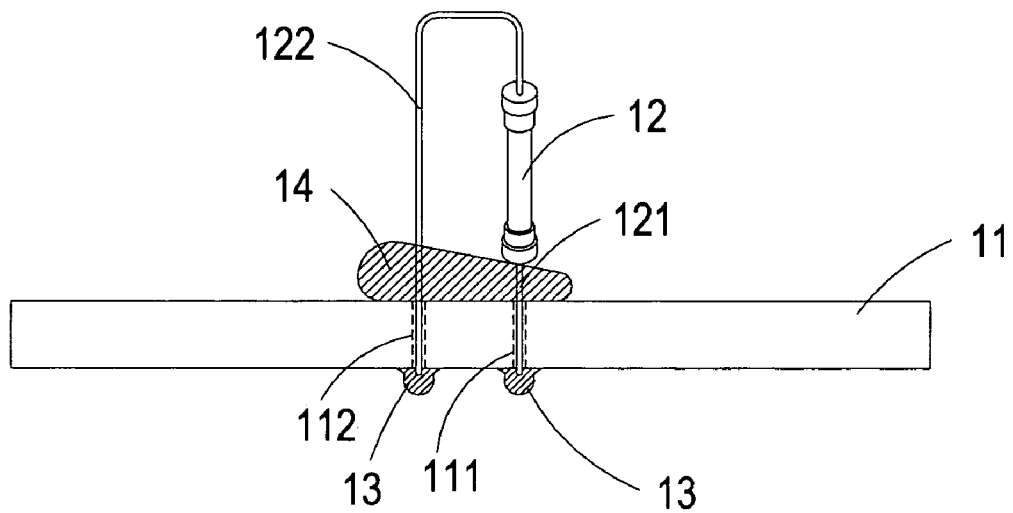
FIG. 1(b) is a schematic view illustrating an electronic component to be mounted on a printed circuit board according to another conventional approach.
Figure 2A:
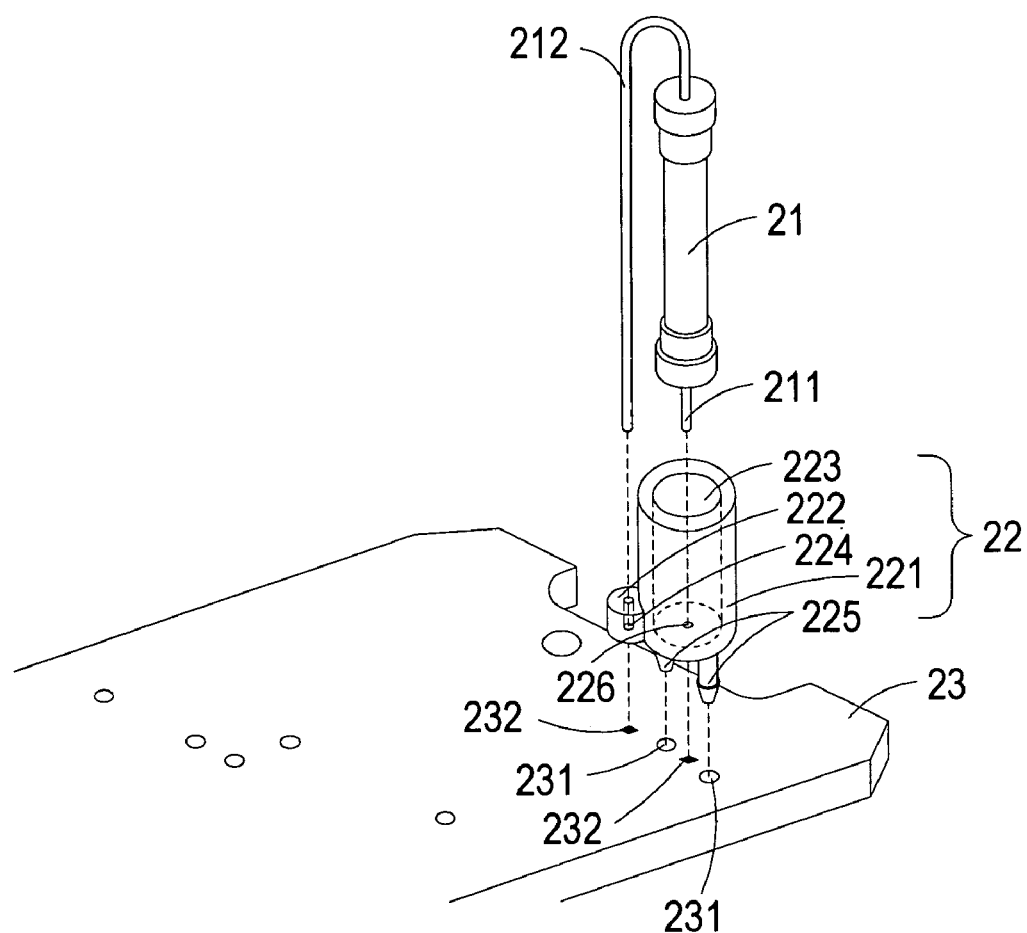
FIG. 2(a) is a schematic exploded view illustrating an electronic component to be mounted on a printed circuit board by means of an auxiliary device according to a preferred embodiment of the present invention.

Please refer to FIG. 2(a), which is a schematic exploded view illustrating an electronic component to be mounted on a printed circuit board by means of an auxiliary device according to a preferred embodiment of the present invention. The electronic component 21 and the auxiliary device 22 are disposed on the top surface of the printed circuit board 23. An example of the electronic component 21 includes a resistor, a capacitor, an inductor, a chip and so on.

The printed circuit board 23 has traces (not shown) on the top surface thereof, a plurality of retaining holes 231 for positioning the auxiliary device 22, and a plurality of contact portions 232 such as via holes or contact pads to be electrically connected to the electronic component 21.

The auxiliary device 22 is used for assisting electrical connection between the pins 211 and 212 of the electronic component 21 and corresponding contact portions 232 of the printed circuit board 23. The auxiliary device 22 comprises a main body and a plurality of connection parts 225. The main body comprises a first sleeve 221 and a second sleeve 222. The first sleeve 221 is coupled to the second sleeve 222 and preferably integrated with each other. The first sleeve 221 has a receptacle 223 and a first perforation 226. By means of the receptacle 223, a partial or the whole electronic component 21 is accommodated and supported within the receptacle 223. The first pin 211 of the electronic component 21 penetrates through the first perforation 226, and touches the corresponding contact portion 232 of the printed circuit board 23. Similarly, the second sleeve 222 has a second perforation 224. The second pin 212 of the electronic component 21 penetrates through the second perforation 224, and touches the corresponding contact portion 232 of the printed circuit board 23.

Figure 2B:
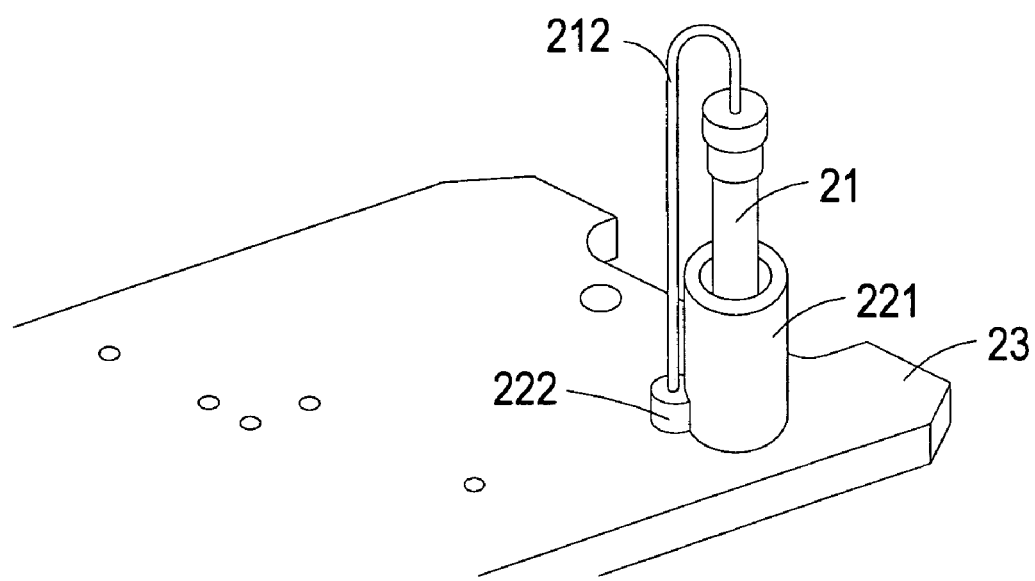
FIG. 2(b) is a schematic assembled view of FIG. 2(a).

The connection parts 225 are disposed at the bottom of the first sleeve 221, and preferably integrated with the first sleeve 221. The connection parts 225 are inserted into corresponding retaining holes 231 and fixed on the printed circuit board 23. In this circumstance, the electronic component 21 is fixed on the printed circuit board 23 via the auxiliary device 22, as shown in FIG. 2(b).

The first sleeve 221 and the second sleeve 222 are connected together, and the distance between the first perforation 226 and the second perforation 224 should be greater than a specified value, for example 5 mm, so as to meet the safe specification. Since the first pin 211 and the second pin 212 of the electronic component 21 are accommodated within the first sleeve 221 and the second sleeve 222, respectively, the safe distance may be maintained even when an external force is applied thereon.

The process for assembling the electronic component 21, the auxiliary device 22 and the printed circuit board 23 will be illustrated as follows with reference to FIGS. 2(a) and 2(b).

First of all, the main body of the electronic component 21 is accommodated within the receptacle 223 of the first sleeve 221. The first pin 211 penetrates through the first perforation 226 of the first sleeve 221. The second pin 222 penetrates through the second perforation 224 of the second sleeve 222. Then, the connection parts 225 of the auxiliary device 22 are inserted into corresponding retaining holes 231 of the printed circuit board 23 so as to be fixed on the printed circuit board 23. In this circumstance, the first pin 211 and the second pin 222 are electrically connected with the corresponding contact portion 232 of the printed circuit board 23.

Alternatively, the connection parts 225 of the auxiliary device 22 are firstly inserted into corresponding retaining holes 231 of the printed circuit board 23 and fixed on the printed circuit board 23. Then, the main body of the electronic component 21 is accommodated within the receptacle 223 of the first sleeve 221, the first pin 211 penetrates through the first perforation 226 of the first sleeve 221, and the second pin 222 penetrates through the second perforation 224 of the second sleeve 222.

From the above description, the auxiliary device of the present invention is capable of assisting electrical connection between pins of an electronic component and corresponding contact portions of a printed circuit board so as to prevent the printed circuit board from being short-circuited or damaged. In addition, the auxiliary device can assist the electrical component to be firmly fixed on the printed circuit board so as to maintain a safe distance when an external force is applied on the electrical component. Accordingly, the electrical property and yield of the electronic product will be enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An auxiliary device for assisting electrical connection between a first pin and a second pin of an electronic component and corresponding contact portions of a printed circuit board, said auxiliary device comprising:
   a main body having a first sleeve with a first perforation disposed therein and a second sleeve with a second perforation disposed therein for said first pin and said second pin to penetrate through said first perforation and said second perforation, respectively; and
   a plurality of connection parts coupled to said main body and penetrating through corresponding retaining holes of said printed circuit board such that said main body is fixed on said printed circuit board, wherein said pins of said electronic component penetrate through corresponding perforations of said main body and are in contact with corresponding contact portions of said printed circuit board.

2. The auxiliary device according to claim 1 wherein said electronic component is selected from a group consisting of a resistor, a capacitor, an inductor and a chip.

3. The auxiliary device according to claim 1 wherein said a first sleeve and said second sleeve are coupled with each other.

4. The auxiliary device according to claim 1 wherein said connection parts are integrated into said main body.

5. The auxiliary device according to claim 1 wherein said first sleeve further comprises a receptacle for accommodating at least a portion of said electronic component.

6. The auxiliary device according to claim 1 wherein the distance between said first perforation and said second perforation is equal to or greater than a specific length.

7. The auxiliary device according to claim 6 wherein said specific length is 5 mm.

8. A packaged structure of an electronic product, comprising:
   a printed circuit board having a plurality of contact portions and a plurality of retaining holes;
   an electronic component having a first pin and a second pin and disposed on a surface of said printed circuit board; and
   an auxiliary device for assisting electrical connection between said first pin and said second pin of said electronic component and corresponding contact portions of said printed circuit board, and comprising a main body and a plurality of connection parts, wherein said main body has a first sleeve with a first perforation disposed therein and a second sleeve with a second perforation disposed therein for said first pin and said second pin to penetrate through said first perforation and said second perforation, respectively, said connection parts are coupled to said main body and penetrate through corresponding retaining holes of said printed circuit board such that said main body is fixed on said printed circuit board, wherein said first pin and said second pin are in contact with corresponding contact portions of said printed circuit board.

9. The packaged structure according to claim 8 wherein said electronic component is selected from a group consisting of a resistor, a capacitor, an inductor and a chip.

10. The packaged structure according to claim 8 wherein said first sleeve and said second sleeve are coupled with each other.

11. The packaged structure according to claim 8 wherein said connection parts are integrated into said main body.

12. The packaged structure according to claim 8 wherein said first sleeve further comprises a receptacle for accommodating at least a portion of said electronic component.

13. The packaged structure according to claim 8 wherein the distance between said first perforation and said second perforation is equal to or greater than a specific length.

14. The packaged structure according to claim 13 wherein said specific length is 5 mm.

* * * * *